(12) United States Patent
Han et al.

(10) Patent No.: US 9,576,864 B2
(45) Date of Patent: Feb. 21, 2017

(54) SHORT-CIRCUIT UNIT AND ARRAY SUBSTRATE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Lei Han, Beijing (CN); Tao Wu, Beijing (CN); Pingyu Wei, Beijing (CN); Hewei Wang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/769,232

(22) PCT Filed: Apr. 20, 2015

(86) PCT No.: PCT/CN2015/076948
§ 371 (c)(1),
(2) Date: Aug. 20, 2015

(87) PCT Pub. No.: WO2016/058348
PCT Pub. Date: Apr. 21, 2016

(65) Prior Publication Data
US 2016/0252792 A1     Sep. 1, 2016

(30) Foreign Application Priority Data

Oct. 13, 2014  (CN) .......................... 2014 1 0538050

(51) Int. Cl.
*H01L 21/66* (2006.01)
*H01L 27/12* (2006.01)
(Continued)

(52) U.S. Cl.
CPC ........... *H01L 22/30* (2013.01); *G02F 1/13439* (2013.01); *G02F 1/133345* (2013.01);
(Continued)

(58) Field of Classification Search
None
See application file for complete search history.

(56) References Cited

FOREIGN PATENT DOCUMENTS

| CN | 1832181 A | 9/2006 |
|---|---|---|
| CN | 201749652 U | 2/2011 |

(Continued)

OTHER PUBLICATIONS

Written Opinion of International Searching Authority dated Jul. 1, 2015 corresponding to International application No. PCT/CN2015/076948.

(Continued)

*Primary Examiner* — Fei Fei Yeung Lopez
(74) *Attorney, Agent, or Firm* — Nath, Goldberg & Meyer; Joshua B. Goldberg; Stanley N. Protigal (57) ABSTRACT

The present invention provides a short-circuit unit comprising: a plurality of signal lines divided into a plurality of groups, each group comprising multiple signal lines, and the multiple signal lines in a same group are not adjacent to each other; a plurality of short-circuit lines, each group of the signal lines correspond to one short-circuit line, and the short-circuit line electrically connects all of the signal lines in the group corresponding to the short-circuit line, the plurality of short-circuit lines are disposed in different layers and the short-circuit lines in different layers are insulated from each other. The present invention also provides an array substrate. In the short-circuit unit of the present invention, the short-circuit lines are disposed in different layers. Compared to the existing solutions in which the short-circuit lines are provided in a same layer, the width (Continued)

occupied by the short-circuit unit of the present invention is smaller.

16 Claims, 8 Drawing Sheets

(51) Int. Cl.
    *G02F 1/1333*     (2006.01)
    *G02F 1/1343*     (2006.01)
    *G02F 1/1362*     (2006.01)

(52) U.S. Cl.
    CPC .. *G02F 1/136204* (2013.01); *G02F 1/136286* (2013.01); *H01L 27/124* (2013.01); *H01L 27/1244* (2013.01); *G02F 2001/13629* (2013.01); *G02F 2001/136254* (2013.01); *G02F 2203/69* (2013.01)

(56) References Cited

FOREIGN PATENT DOCUMENTS

| CN | 102244082 A | 11/2011 |
|----|-------------|---------|
| CN | 104051455 A | 9/2014 |
| CN | 104280912 A | 1/2015 |
| JP | 2003207759 A | 7/2003 |
| KR | 20030058107 | * 7/2003 |

OTHER PUBLICATIONS

1st office action issued in corresponding Chinese application No. 201410538050.5 dated Aug. 22, 2016.

* cited by examiner

SHORT-CIRCUIT UNIT AND ARRAY SUBSTRATE

This is a National Phase Application filed under 35 U.S.C. 371 as a national stage of PCT/CN2015/076948, filed Apr. 20, 2015, an application claiming the benefit of Chinese Application No. 201410538050.5, filed Oct. 13, 2014, the content of each of which is hereby incorporated by reference in its entirety.

FIELD OF THE INVENTION

Embodiments of the present invention relates to the field of display technology, and in particular to a short-circuit unit and an array substrate including the short-circuit unit.

BACKGROUND OF THE INVENTION

During manufacturing of liquid crystal display panel, firstly the aligned and assembled liquid crystal cell is cut to from a liquid crystal display panel. After the liquid crystal display panel is formed, the liquid crystal display panel is subjected to a lighting detection to determine the quality of the liquid crystal display panel.

Figure 1:
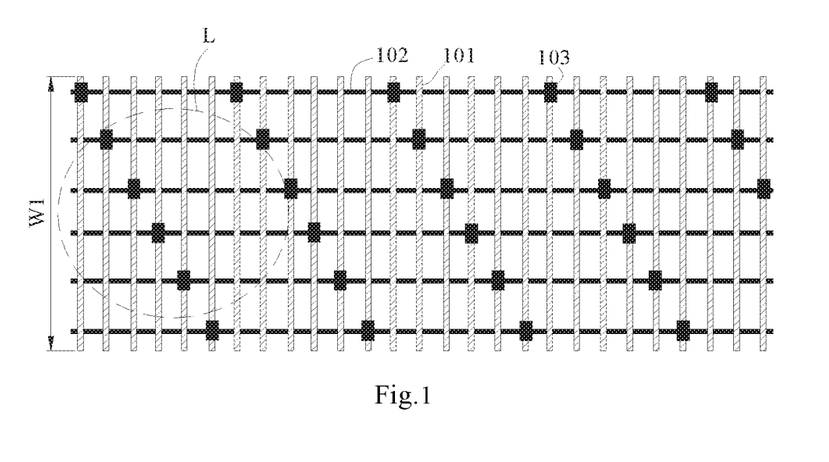
FIG. 1 is a schematic view of the conventional short-circuit unit.

When performing the lighting detection on the liquid crystal display panel, a short-circuit unit is required. FIG. 1 shows a common short-circuit unit including short-circuit lines 102 and signal lines 101 disposed in different layers, wherein the number of the short-circuit lines 102 is six, the number of the signal lines 101 is the same as the number of data lines of the liquid crystal display panel provided with the short-circuit unit. The signal lines 101 can be divided into six groups each corresponding to a short-circuit line 102, and the signal lines 101 are electrically connected to a corresponding short-circuit line 102 through a via hole 103.

When performing the lighting detection, the signal lines 101 are connected in one-to-one correspondence with the data lines of the liquid crystal display panel. After the lighting detection is completed, the short-circuit unit will be removed from the array substrate using laser beam L having certain diameter. Since the short-circuit unit has large width and the diameter of the laser beam is limited, during removal of the short-circuit unit, there is a risk that the short-circuit lines in the short-circuit unit are not completely removed. If the diameter of the laser beam L is increased, the laser beam L may have insufficient power, resulting in the like problem that the short-circuit lines in the short-circuit unit are not completely removed. If there is residue of the short-circuit unit on the array substrate, the subsequent test equipment would be damaged.

Since the short-circuit unit occupies larger width, it is not conducive to a narrow frame design of the liquid crystal display panel, and there is a risk that the short-circuit lines in the short-circuit unit are not completely removed.

SUMMARY OF THE INVENTION

Embodiments of the present invention provide a short-circuit unit and an array substrate including the short-circuit unit. The short-circuit unit occupies smaller width, which is conducive to the narrow frame design of the liquid crystal display panel. Further, when the short-circuit unit is removed from the array substrate, the risk of residue of the short-circuit unit becomes smaller.

To achieve the above object, the embodiments of the present invention provide a short-circuit unit comprising:

a plurality of signal lines, which are divided into a plurality of groups, each group comprising multiple signal lines, and the multiple signal lines in a same group are not adjacent to each other; and a plurality of short-circuit lines, wherein each group of the signal lines correspond to one short-circuit line, and said short-circuit line electrically connects all of the signal lines in the group of the signal lines corresponding to said short-circuit line, the plurality of short-circuit lines are disposed in different layers, and the short-circuit lines in different layers are insulated from each other.

Preferably, the plurality of short-circuit lines comprise a plurality of first short-circuit lines and a plurality of second short-circuit lines, the plurality of first short-circuit lines are disposed in a same layer, and the plurality of second short-circuit lines are disposed in a same layer.

Preferably, the number of the first short-circuit lines is at least three, and the number of the second short-circuit lines is at least three.

Preferably, the first short-circuit lines and the second short-circuit lines extend in a same direction, and the orthographic projection of the second short-circuit lines on the layer where the first short-circuit lines are located overlaps at least a part of the first short-circuit lines.

Preferably, the first short-circuit lines are located in a layer below the signal lines, the first short-circuit lines are insulated from the signal lines by a first insulation layer, the second short-circuit lines are located in a layer above the signal lines, the second short-circuit lines are insulated from the signal lines by a second insulation layer, a first short-circuit line is electrically connected with the corresponding signal lines through a first via hole above the first short-circuit line and penetrating the first insulation layer, the second short-circuit line is electrically connected with the corresponding signal lines through a second via hole below the second short-circuit line and penetrating the second insulation layer.

Preferably, the first short-circuit line is made of metal material; and/or
the second short-circuit line is made of transparent electrode material.

Preferably, a third insulation layer is formed above the second short-circuit lines.

Preferably, the first short-circuit lines are located in a layer below the signal lines, the first short-circuit lines are insulated from the signal lines by a fourth insulation layer, the second short-circuit lines are located in a same layer as the signal lines and the signal lines are disposed at one side of the second short-circuit lines.

The short-circuit unit further comprises:
a plurality of first connecting members, wherein the plurality of first connecting members are divided into a plurality of groups in one-to-one correspondence with first short-circuit lines, each group comprises multiple first connecting members, each of the first short-circuit lines is electrically connected with the group of the first connecting members corresponding to the first short-circuit line, and each of the first connecting members is connected to a corresponding signal line;

a plurality of second connecting members, wherein the plurality of second connecting members are divided into a plurality of groups in one-to-one correspondence with second short-circuit lines, each group comprises multiple second connecting members, each of the second short-circuit lines is electrically connected with the group of the second connecting members corresponding to the second short-circuit line, and each of the second connecting members is connected to a corresponding signal line.

Preferably, the short-circuit unit further comprises a plurality of third connecting members, a part of the plurality of third connecting members are configured for connecting the first connecting members with corresponding signal lines, and the other of the plurality of third connecting members are configured for connecting the second connecting members with corresponding signal lines.

Preferably, the third connecting members are disposed in the upper layer of the second connecting members, and the third connecting members are insulated from the second connecting members by a fifth insulation layer;

the third connecting members configured for connecting the first connecting members with corresponding signal lines are connected with the first connecting members through third via holes penetrating the fourth and fifth insulation layers, and are connected with the signal lines through fourth via holes penetrating the fifth insulation layer; and the third connecting members configured for connecting the second connecting members with corresponding signal lines are connected with the second connecting members through fifth via holes penetrating the fifth insulation layer, and are connected with the signal lines through sixth via holes penetrating the fifth insulation layer.

Preferably, the third connecting members are made of transparent electrode material.

Preferably, a sixth insulation layer is formed above the third connecting members.

As another aspect of the embodiments of the present invention, an array substrate is provided. The array substrate comprises a display region and a non-display region surrounding the display region, the display region is provided with a plurality of data lines and a plurality of gate lines, the non-display region is provided with a short-circuit unit, wherein the short-circuit unit comprises:

a plurality of signal lines, which are divided into a plurality of groups, each group comprising multiple signal lines, and the multiple signal lines in a same group are not adjacent to each other; and a plurality of short-circuit lines, wherein each group of the signal lines correspond to one short-circuit line, and said short-circuit line electrically connects all of the signal lines in the group of the signal lines corresponding to said short-circuit line, the plurality of short-circuit lines are disposed in different layers, and the short-circuit lines in different layers are insulated from each other.

Preferably, the plurality of short-circuit lines comprise a plurality of first short-circuit lines and a plurality of second short-circuit lines, the plurality of first short-circuit lines are disposed in a same layer, and the plurality of second short-circuit lines are disposed in a same layer.

Preferably, the number of the first short-circuit lines is at least three, and the number of the second short-circuit lines is at least three.

Preferably, the first short-circuit lines and the second short-circuit lines extend in a same direction, and the orthographic projection of the second short-circuit lines on the layer where the first short-circuit lines are located overlaps at least a part of the first short-circuit lines.

Preferably, the signal lines and the data lines are disposed in a same layer, the first short-circuit lines and the gate lines are disposed in a same layer, and a first insulation layer is disposed between the first short-circuit lines and the signal lines; the first insulation layer is located in the layer of a gate insulation layer of the array substrate, the second short-circuit lines are located in the layer of pixel electrodes of the array substrate, a second insulation layer is disposed between the second short-circuit lines and the signal lines; a first short-circuit line is electrically connected with the corresponding signal lines through a first via hole above the first short-circuit line and penetrating the first insulation layer, a second short-circuit line is electrically connected with the corresponding signal lines through a second via hole below the second short-circuit line and penetrating the second insulation layer.

Preferably, the first short-circuit lines are located in a layer below the signal lines, the second short-circuit lines are located in a same layer as the signal lines and the signal lines are disposed at one side of the second short-circuit lines.

the short-circuit unit further comprises:

a plurality of first connecting members, which are divided into a plurality of groups in one-to-one correspondence with first short-circuit lines, each group comprises multiple first connecting members, and each of the first short-circuit lines is electrically connected with the group of the first connecting members corresponding to the first short-circuit line;

a plurality of second connecting members, which are divided into a plurality of groups in one-to-one correspondence with second short-circuit lines, each group comprises multiple second connecting members, and each of the second short-circuit lines is electrically connected with the group of the second connecting members corresponding to the second short-circuit line.

Preferably, the short-circuit unit further comprises a plurality of third connecting members, a part of the plurality of third connecting members are configured for connecting the first connecting members with corresponding signal lines, and the other of the plurality of third connecting members are configured for connecting the second connecting members with corresponding signal lines.

Preferably, the array substrate comprises a first transparent electrode and a second transparent electrode below the first transparent electrode, the first short-circuit lines are disposed in the layer of the gate lines of the array substrate, the second short-circuit lines are disposed in the layer of the data lines, the third connecting members are disposed in the layer of the first transparent electrode, and a fifth insulation layer is provided between the third connecting members and the second connecting members;

the third connecting members configured for connecting the first connecting members with corresponding signal lines are connected with the first connecting members through the third via holes penetrating the fourth and fifth insulation layers, and are connected with the signal lines through the fourth via holes penetrating the fifth insulation layer; and the third connecting members configured for connecting the second connecting members with corresponding signal lines are connected with the second connecting members through the fifth via holes penetrating the fifth insulation layer, and are connected with the signal lines through the sixth via holes penetrating the fifth insulation layer.

According to the short-circuit unit provided in the present embodiment, the plurality of short-circuit lines are disposed in different layer. Compared to the existing solutions in which the short-circuit lines are provided in a same layer, the width occupied by the short-circuit unit of the present embodiment is smaller than that of the prior art solutions.

When the short-circuit unit is provided in the array substrate, it is located in the peripheral region of the array substrate. By using the short-circuit unit provided in the present embodiment, the short-circuit lines are disposed in different layers, thereby the plane area occupied by the short-circuit unit is reduced, the width of the peripheral region of the array substrate is reduced, and the narrow frame design of the display panel including the array substrate is facilitated.

BRIEF DESCRIPTION OF THE DRAWINGS

In order to clearly illustrate the technical solution of the embodiments of the present invention, the accompanied drawings for description of the embodiments or related technology will be introduced briefly. Apparently, the drawings described in the following relate to only some embodiments of the present invention, and do not form a limitation to the present invention.

FIG. 6b is a plan view of FIG. 6a;

FIG. 8b is a plan view of FIG. 8a;

FIG. 9b is a plan view of FIG. 9a;

FIG. 11b is a plan view of FIG. 11a;

FIG. 12b is a plan view of FIG. 12a;

FIG. 20b is a plan view of FIG. 20a;

FIG. 22b is a plan view of FIG. 22a;

FIG. 24b is a plan view of FIG. 24a;

DETAILED DESCRIPTION OF THE EMBODIMENTS

In the following, the technical solutions of the embodiments of the present invention will be described clearly and completely. Apparently, the described embodiments are merely a part of the embodiments of the present invention, but not all of the embodiments. Based on the described embodiments of the present invention, other embodiments can be achieved by persons of ordinary skill in the art without creative work, and drop within the protective scope of the present invention.

As an aspect of the present invention, there is provided a short-circuit unit comprising:

a plurality of signal lines, wherein the plurality of the signal lines are divided into a plurality of groups, each group comprises multiple signal lines, and the multiple signal lines in a same group are not adjacent to each other;

a plurality of short-circuit lines, wherein each group of the signal lines correspond to one short-circuit line, and all of the signal lines in the group of the signal lines corresponding to one short-circuit line are electrically connected (i.e. short circuited) by the short-circuit line, the plurality of short-circuit lines are disposed in different layers, and the short-circuit lines in different layers are insulated from each other.

Figure 3:
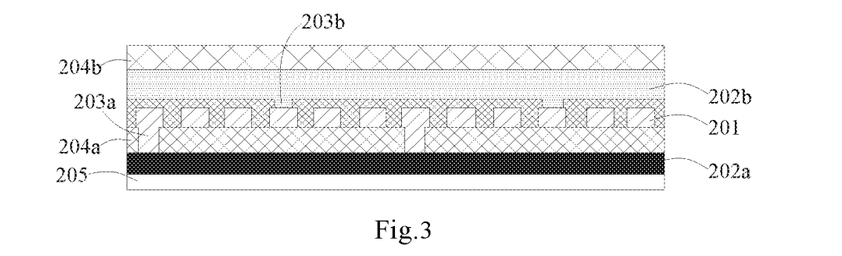
FIG. 3 is a cross-sectional view of the short-circuit unit as shown in FIG. 2 along AA'.

It can be readily understood that "different layers" herein refer to the different layers in the thickness direction of the short-circuit unit, and the thickness direction of the short-circuit unit is the up-down direction in FIG. 3.

Figure 2:
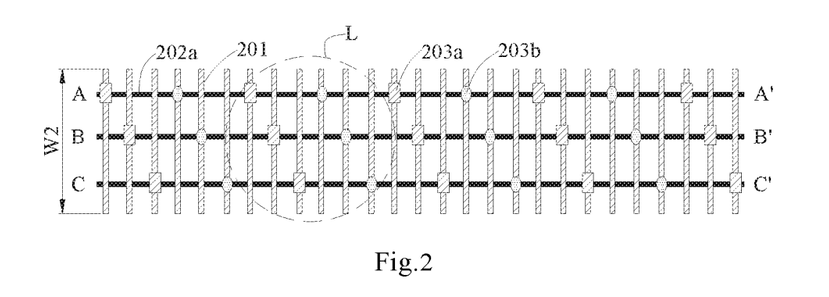
FIG. 2 is a schematic top view of the short-circuit unit according to a first embodiment of the present invention, wherein only the positional relationship among the signal line, the first short-circuit line, the first via hole and the second via hole is illustrated.

In the short-circuit unit shown in FIG. 1, the plurality of short-circuit lines 102 are disposed in a same layer, and the width of the short-circuit unit is W1. In the short-circuit unit provided by the embodiments of the present invention, the plurality of short-circuit lines are disposed in different layers. Compared to the case of FIG. 1 where the short-circuit lines 102 are disposed in a same layer, the width of the short-circuit unit of the embodiments of the present invention (the width of the short-circuit unit in the embodiment of FIG. 2 is W2, and the width of the short-circuit unit in the embodiment of FIG. 3 is W3) is obviously smaller than the width W1 of the short-circuit unit in FIG. 1.

When the short-circuit unit is provided in the array substrate, it is located in the peripheral region of the array substrate. In the short-circuit unit provided by the present embodiment, the plurality of short-circuit lines are disposed in different layers, thereby the plane area occupied by the short-circuit unit is reduced, the width of the peripheral region of the array substrate is reduced, and the narrow frame design of the display panel including the array substrate is facilitated.

Furthermore, since the width of the short-circuit unit is smaller, it is easy to adopt laser beam L having smaller diameter while keeping the diameter of the laser beam larger than the width of the short-circuit unit, such that the laser beam L can have higher power, and the laser beam L can cover the whole width of the short-circuit unit when removing the short-circuit unit. In this case, when the short-circuit unit provided by the present embodiment is removed by the laser beam, the short-circuit unit can be removed completely, thereby the problem of residue of short-circuit lines of the short-circuit unit on the array substrate after the lighting detection is finished can be reduced.

In the present embodiment, the specific structure of the short-circuit unit is not limited, as long as the short-circuit lines of the short-circuit unit are disposed in different layers to reduce the occupied width of the short-circuit unit on the plane.

For simplification of manufacturing process, preferably the plurality of short-circuit lines can be disposed in two different layers. Specifically, as shown in FIGS. 3 through 5 and FIGS. 13 through 19, the short-circuit lines comprise a plurality of first short-circuit lines 202a and a plurality of second short-circuit lines 202b, the plurality of first short-circuit lines 202a are disposed in a same layer, and the plurality of second short-circuit lines 202b are disposed in a same layer.

As an embodiment of the present invention, the short-circuit unit may comprise at least three first short-circuit lines 202a and at least three second short-circuit lines 202b. In an embodiment of the present invention, the number of the first short-circuit lines 202a and the second short-circuit lines 202b are both three, and the short-circuit lines 201 are accordingly divided into six groups.

In order to reduce the overall width of the short-circuit unit, preferably, the first short-circuit lines 202a and the second short-circuit lines 202b extend in a same direction, and the orthographic projection of the second short-circuit lines 202b on the layer where the first short-circuit lines 202a are located overlaps at least a part of the first short-circuit lines 202a.

Preferably, the number of the second short-circuit lines 202b is the same as the number of the first short-circuit lines 202a, the orthographic projection of the plurality of second short-circuit lines 202b on the layer where the first short-circuit lines 202a are located correspond to the plurality of first short-circuit lines 202a respectively, thereby the width of the short-circuit unit on the plane can be further reduced.

As mentioned above, the short-circuit lines are configured for short-circuiting a group of signal lines. To achieve the object, two specific implementations for short-circuiting the signal lines using a short-circuit line will be described as follows.

Figure 4:
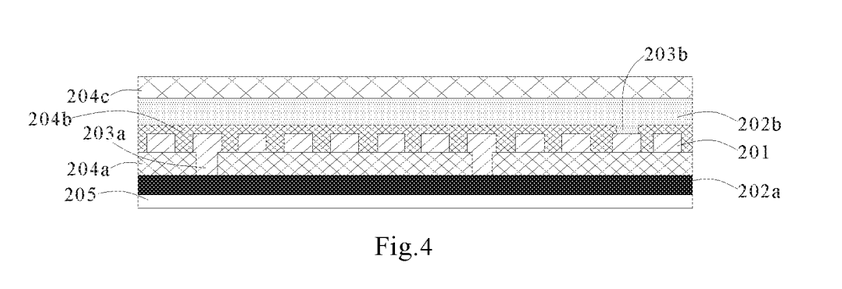
FIG. 4 is a cross-sectional view of the short-circuit unit as shown in FIG. 2 along BB'.
Figure 5:
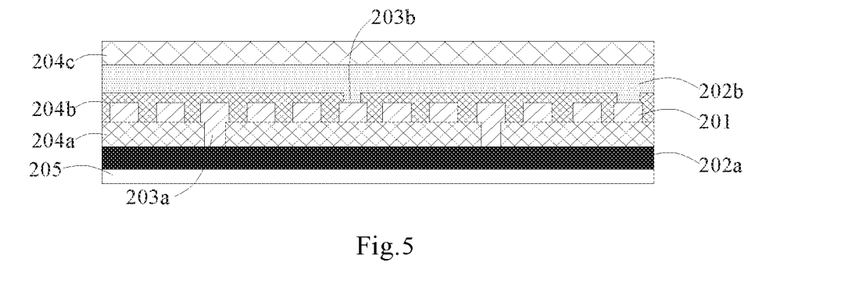
FIG. 5 is a cross-sectional view of the short-circuit unit as shown in FIG. 2 along CC'.

FIGS. 2 through 5 show a first embodiment of the present invention. As shown in FIGS. 3 through 5, the first short-circuit lines 202a are located in a layer below the signal lines 201, the first short-circuit lines 202a are insulated from the signal lines 201 by a first insulation layer 204a, the second short-circuit lines 202b are located in a layer above the signal lines 201, the second short-circuit lines 202b are insulated from the signal lines 201 by a second insulation layer 204b, a first short-circuit line 202a is electrically connected with a corresponding signal line 201 through a first via hole 203a above the first short-circuit line 202a and penetrating the first insulation layer 204a, and the second short-circuit line 202b is electrically connected with a corresponding signal line 201 through a second via hole 203b below the second short-circuit line 202b and penetrating the second insulation layer 204b.

FIG. 2 shows only the first short-circuit line 202a, it can be seen from the figure that the group of signal lines electrically connected with the first short-circuit line 202a in the first row include $1^{st}$, $7^{th}$, $13^{th}$, $19^{th}$ and $25^{th}$ columns of signal lines, the group of signal lines electrically connected with the first short-circuit line 202a in the second row includes $2^{nd}$, $8^{th}$, $14^{th}$, $20^{th}$ and $26^{th}$ columns of signal lines, the group of signal lines electrically connected with the first short-circuit line 202a in the third row includes $3^{rd}$, $9^{th}$, $15^{th}$, $21^{th}$ and $27^{th}$ columns of signal lines. It is readily understood that the signal lines are arranged from left to right.

FIG. 3 shows a partial cross-sectional view of the short-circuit lines in the first row. It can be seen from FIG. 3 that, the first short-circuit line 202a in the first row is electrically connected with the first column of signal line through a first via hole 203a and is electrically connected with the seventh column of signal line through another first via hole, i.e. the first short-circuit line 202a in the first row short-circuits the first and seventh column of signal lines. Also, it can be seen from FIG. 3 that the second short-circuit line 202b (it can be seen from the figure that the orthographic projection of a second short-circuit line 202b on the layer where the first short-circuit line 202a is located overlaps a first short-circuit line 202a) in the first row is electrically connected with the fourth column of signal line through a second via hole 203b and is electrically connected with the $10^{th}$ column of signal line through another second via hole, i.e. the second short-circuit line 202b in the first row short-circuits the $4^{th}$ and $10^{th}$ column of signal lines.

FIG. 4 shows a partial cross-sectional view of the short-circuit lines in the second row in the short-circuit unit shown in FIG. 2. It can be seen from FIG. 4 that, the first short-circuit line 202a in the second row is electrically connected with the second column of signal line through a first via hole 203a and is electrically connected with the eighth column of signal line through another first via hole, i.e. the first short-circuit line 202a in the second row short-circuits the second and eighth column of signal lines. Also, it can be seen from FIG. 4 that the second short-circuit line 202b in the second row is electrically connected with the $11^{th}$ column of signal line through a second via hole 203b. Of course the second short-circuit line 202b in the second row is electrically connected with other column of signal line, which is not shown in FIG. 4.

FIG. 5 shows a partial cross-sectional view of the short-circuit lines in the third row in the short-circuit unit shown in FIG. 2. It can be seen from FIG. 5 that, the first short-circuit line 202a in the third row is electrically connected with the third column of signal line through a first via hole 203a and is electrically connected with the ninth column of signal line through another first via hole, i.e. the first short-circuit line 202a in the third row short-circuits the third and ninth column of signal lines. Also, it can be seen from FIG. 5 that the second short-circuit line 202b in the third row is electrically connected with the sixth column of signal line through a second via hole 203b and is electrically connected with the $12^{th}$ column of signal line through another second via hole, i.e. the second short-circuit line 202b in the third row short-circuits the sixth and $12^{th}$ column of signal lines.

In the disclosed embodiments of the present invention, the material forming the first short-circuit line 202a is not specifically limited, as long as it is conductive material. For example, the first short-circuit line 202a can be made of metal material. It is easily understood that, the short-circuit unit is formed on the base substrate 205, and the base substrate 205 is a base for the array substrate. In order to simplify the manufacturing process of the array substrate and the short-circuit unit, preferably, the first short-circuit lines 202a can be formed while forming the gate lines of the array substrate.

Similarly, in the embodiment of the present invention, the material forming the second short-circuit line 202b is not specifically limited, as long as it is conductive. For example, the second short-circuit line 202b can be made of transparent electrode material (e.g., ITO). As described above, the short-circuit unit is formed simultaneously with the array substrate, therefore the second short-circuit line 202b can be formed simultaneously with the top transparent electrode (one of the common electrode and the pixel electrode) of the array substrate.

As described above, the layer of the first short-circuit lines 202a is insulated from the layer of the signal lines 201 by the first insulation layer 204a, the first insulation layer 204a can be formed simultaneously with the gate insulation layer of the array substrate. The layer of the signal lines 201 is insulated from the layer of the second short-circuit line 202b by the second insulation layer 204b, the second insulation layer 204b can be formed simultaneously with the planarization layer of the array substrate. Preferably a third insulation layer 204c can be formed above the second short-circuit line 202b to protect the short-circuit unit from being worn.

Figure 6A:
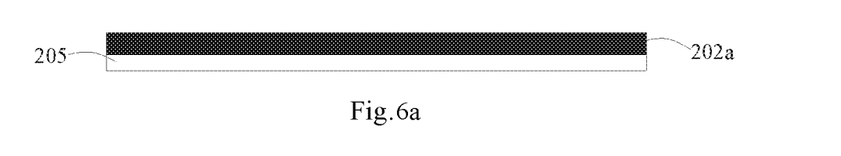
FIG. 6a is a cross-sectional view along CC' when the first short-circuit lines are formed on the substrate.
Figure 6B:
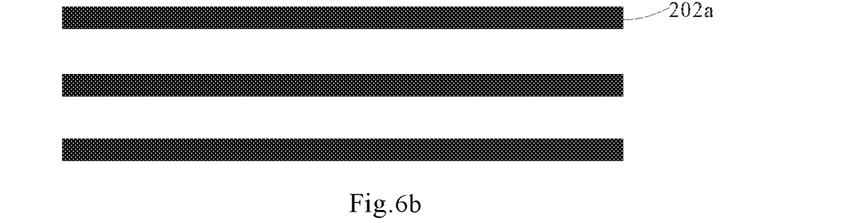
Figure 7:
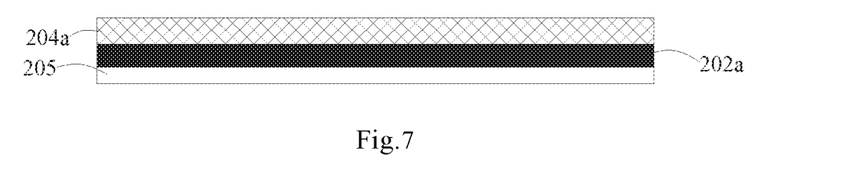
FIG. 7 is a cross-sectional view along CC' when the first insulation layer is formed on the substrate.
Figure 8A:
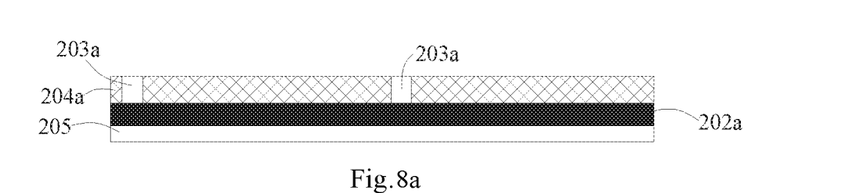
FIG. 8a is a cross-sectional view along CC' when the first via hole is formed on the first insulation layer.
Figure 8B:
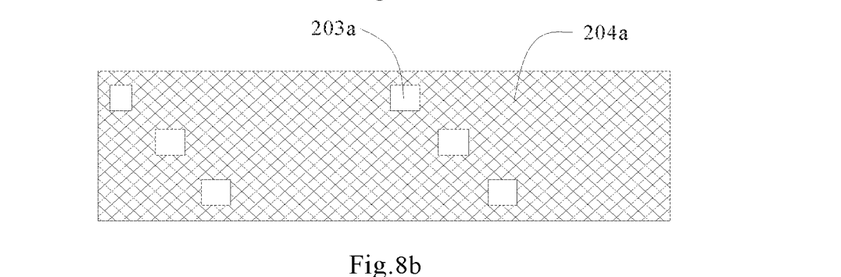
Figure 9A:
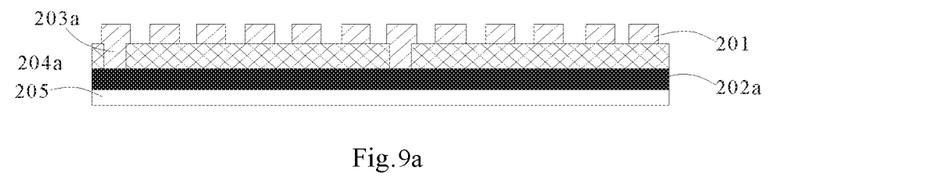
FIG. 9a is a cross-sectional view along CC' when the signal lines are formed on the first insulation layer.
Figure 9B:
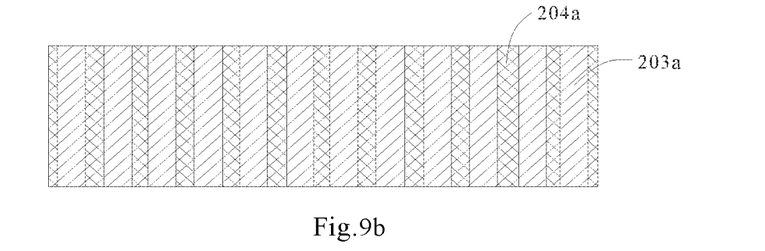
Figure 10:
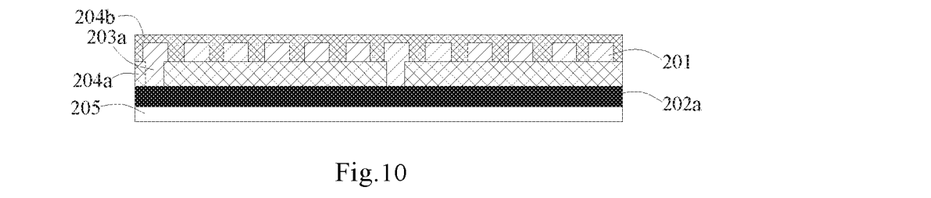
FIG. 10 is a cross-sectional view along CC' when the second insulation layer is formed above the signal lines.
Figure 11A:
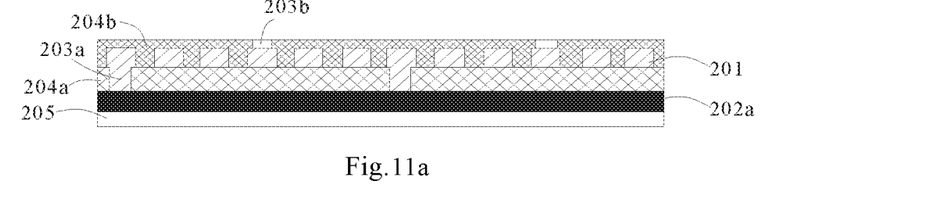
FIG. 11a is a cross-sectional view along CC' when the second via hole is formed on the second insulation layer.
Figure 11B:
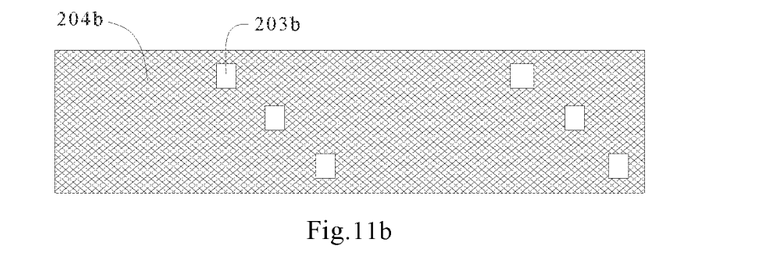
Figure 12A:
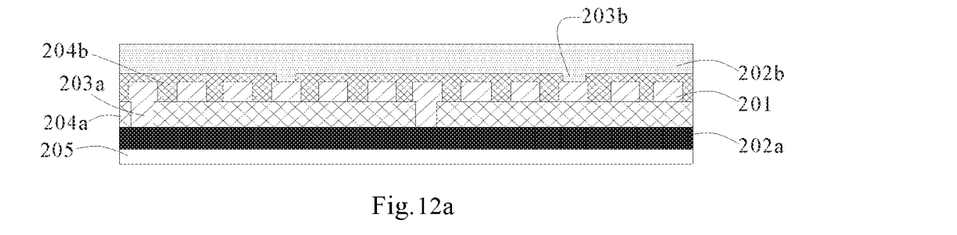
FIG. 12a is a cross-sectional view along CC' when the second short-circuit lines are formed on the second insulation layer.
Figure 12B:
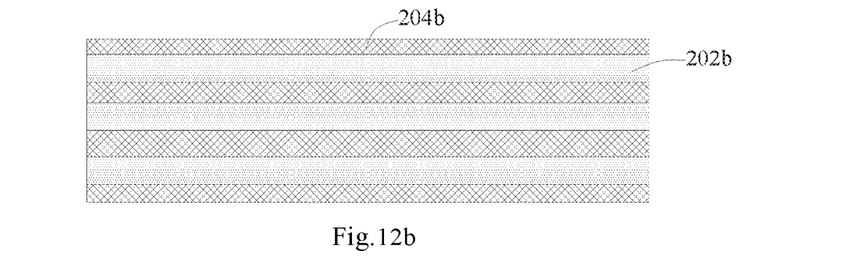

FIGS. 6a through 12b show the schematic views of forming the short-circuit unit of the first embodiment. As shown in the figures, forming the short-circuit unit of the first embodiment comprises the following steps:

S1, forming a pattern including the first short-circuit line 202a (as shown in FIGS. 6a and 6b) on the base substrate 205;

S2, forming a first insulation layer 204a on the formed pattern including the first short-circuit line 202a (as shown in FIG. 7);

S3, forming a first via hole 203a on the first insulation layer 204a (as shown in FIGS. 8a and 8b);

S4, forming a pattern including the signal line 201, wherein the material forming the signal line 201 is filled in the first via hole 203a, so that the signal line and the corresponding first short-circuit line are electrically connected (as shown in FIGS. 9a and 9b);

S5, forming a second insulation layer 204b on the pattern including the signal line 201 (as shown in FIG. 10);

S6, forming a second via hole 230b on the second insulation layer 204b (as shown in FIGS. 11a and 11b);

S7, forming a pattern including the second short-circuit lines 203b above the second insulation layer 204b having the second via hole 230b, wherein the material forming the second short-circuit lines 203b is filled in the second via hole 230b, so that the second short-circuit lines 203b and the corresponding signal lines 201 are electrically connected;

S8, forming a third insulation layer 204c on the base substrate formed with the second signal lines 201 (see FIG. 3).

In step S1, the pattern including the first short-circuit line 202a can be formed by a patterning process such as transferring, printing, and conventional photolithographic processing. When the pattern including the first short-circuit line 202a is formed by conventional photolithographic patterning process, the step S1 may includes:

S11, depositing a metal film on the base substrate;

S12, forming a photoresist layer on the metal film;

S13, exposing and developing the photoresist layer through a mask plate, to form a pattern corresponding to the first short-circuit line in the photoresist layer;

S14, etching the metal film to form a pattern including the first short-circuit line.

In the step S14, the metal film can be etched using dry etching process or wet etching process.

The process of steps S4 and S7 is similar to the step S1, and is not repeated herein.

Hereinafter, the short-circuit unit according to the second embodiment of the present invention will be described in conjunction with FIGS. 13 through 25.

As shown in FIGS. 13 through 19, the first short-circuit lines 202a are located in a layer below the signal lines 201, the first short-circuit lines 202a are insulated from the signal lines 201 by a fourth insulation layer 204d, the second short-circuit lines 202b are located in a same layer as the signal lines 201 and the signal lines 201 are disposed at one side of the second short-circuit lines202b.

Preferably, the short-circuit unit further comprises:

a plurality of first connecting members, the plurality of first connecting members are divided into a plurality of groups in one-to-one correspondence with first short-circuit lines, each group comprises multiple first connecting members, and each of the first short-circuit lines is electrically connected with the group of the first connecting members corresponding to the first short-circuit line, each of the first connecting members is connected with a corresponding signal line;

a plurality of second connecting members, the plurality of second connecting members are divided into a plurality of groups in one-to-one correspondence with second short-circuit lines, each group comprises multiple second connecting members, and each of the second short-circuit lines is electrically connected with the group of the second connecting members corresponding to the second short-circuit line, each of the second connecting members is connected with a corresponding signal line.

In the second embodiment, it is readily understood that the groups of first connecting members correspond to the groups of signal lines corresponding to first short-circuit lines. The first connecting members in one group are configured for connecting the signal lines in one group with a first short-circuit line.

Similarly, the groups of second connecting members correspond to the groups of signal lines corresponding to second short-circuit lines. The second connecting members in one group are configured for connecting the signal lines in one group with a second short-circuit line.

Preferably, the short-circuit unit further comprises a plurality of third connecting members, a part of the plurality of third connecting members are configured for connecting the first connecting members with corresponding signal lines, and the other of the plurality of third connecting members are configured for connecting the second connecting members with corresponding signal lines.

In the present embodiment, the specific configuration of the third connecting members is not specifically limited, as long as the third connecting members can connect the first connecting members with corresponding signal lines and connect the second connecting members with corresponding signal lines. In a specific embodiment, the third connecting members are disposed in the upper layer of the second connecting members, and the third connecting members are insulated from the second connecting members by a fifth insulation layer 204e. In this embodiment, the first connecting members are connected with corresponding third connecting members through via holes, and the second connecting members are connected with corresponding third connecting members through via holes.

As shown in FIGS. 14 through 18, the third connecting members 206 configured for connecting the first connecting members (including the first connecting members $202a_1$, $202a_2$, $202a_3$) with corresponding signal lines 201 are connected with the first connecting members through third via holes 203c penetrating the fourth and fifth insulation layers 204d and 204e, and are connected with the signal lines 201 through fourth via holes 203d penetrating the fifth insulation layer 204e. The third connecting members 206 configured for connecting the second connecting members (including the second connecting members $202b_1$, $202b_2$, $202b_3$) with corresponding signal lines 201 are connected with the second connecting members through fifth via holes 203e penetrating the fifth insulation layer 204e, and are connected with the signal lines 201 through sixth via holes 203f penetrating the fifth insulation layer 204e.

In the embodiment of the present invention, the material forming the third connecting members 206 is not specifically limited, as long as it is conductive. As an embodiment, the third connecting members 206 can be made of transparent electrode material. In this embodiment, the third connecting members 206 can be formed simultaneously with the transparent electrode on the uppermost layer of the array substrate (one of the common electrode and the pixel electrode).

Figure 13:
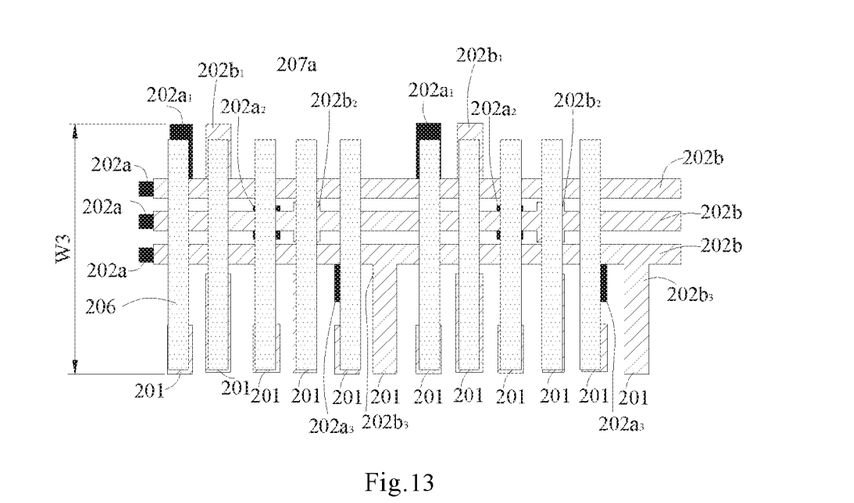
FIG. 13 is a schematic top view of the short-circuit unit according to a second embodiment of the present invention.

In the embodiment shown in FIG. 13, the number of the first short-circuit lines 202a and the number of the second short-circuit lines 202b are both three. Accordingly, in the embodiment shown in FIG. 13, the first connecting members are divided into three groups, a first group comprising a first connecting member $202a_1$, a second group comprising a first connecting member $202a_2$, and a third group comprising a first connecting member $202a_3$; the first connecting member $202a_1$ is connected with a first short-circuit line in the first row, the first connecting member $202a_2$ is connected with a first short-circuit line in the second row, and the first connecting member $202a_3$ is connected with a first short-circuit line in the third row. The second connecting members are also divided into three groups, a first group comprising a second connecting member $202b_1$, a second group comprising a second connecting member $202b_2$, and a third group comprising a second connecting member $202b_3$; note that the second connecting member $202b_3$ is formed integrally with corresponding signal lines 201, the second connecting member $202b_1$ is connected with a second short-circuit line in the first row, the second connecting member $202b_2$ is connected with a second short-circuit line in the second row, and the second connecting member $202b_3$ is connected with a second short-circuit line in the third row.

The first connecting members $202a_1$, $202a_2$, $202a_3$ are electrically connected with corresponding signal lines 201 by the respective third connecting members 206. The second connecting members $202b_1$, $202b_2$, $202b_3$ are electrically connected with corresponding signal lines 201 by the respective third connecting members 206. If the second connecting member $202b_3$ is formed integrally with corresponding signal lines 201, the third connecting member 206 is not needed to connect the second connecting member $202b_3$ with the signal lines 201; and if the second connecting member $202b_3$ is isolated from the signal lines, the third connecting member 206 is needed to connect the second connecting member $202b_3$ with the signal lines 201.

Figure 14:
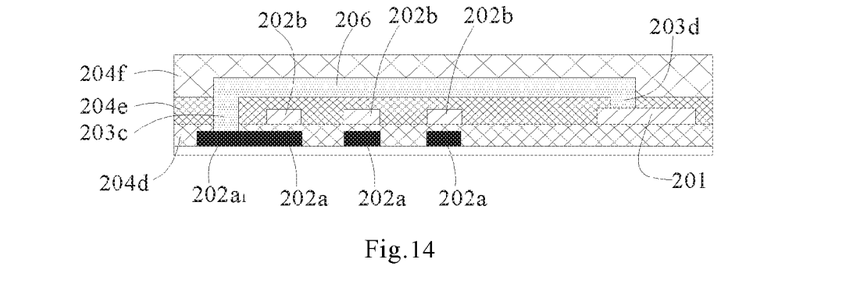
FIG. 14 is a cross-sectional view of the short-circuit unit as shown in FIG. 13 along the first column of signal line.

As shown in FIG. 14, the signal lines 201 in the first column are short-circuited with the first short-circuit line 202a in the first row through the first connecting member $202a_1$ and the third connecting member 206, the third connecting member 206 is connected with the first short-circuit line $202a_1$ through the third via hole 203c penetrating the fourth insulation layer 204d and the fifth insulation layer 204e, and the third connecting member 206 is connected with the signal lines 201 in the first column through the fourth via hole 203d penetrating the fifth insulation layer 204e.

Figure 15:
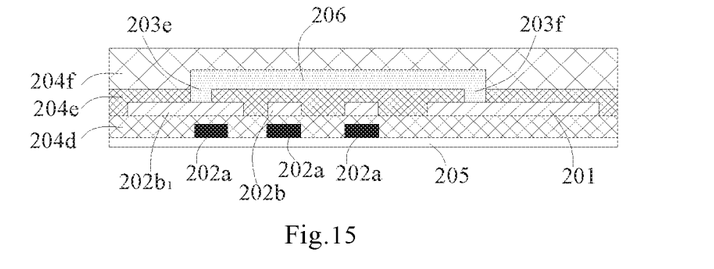
FIG. 15 is a cross-sectional view of the short-circuit unit as shown in FIG. 13 along the second column of signal line.

As shown in FIG. 15, the signal lines 201 in the second column are short-circuited with the second short-circuit line 202b in the first row through the second connecting member $202b_1$ and the third connecting member 206, the third connecting member 206 is connected with the second connecting member $202b_1$ through the fifth via hole 203e penetrating the fifth insulation layer 204e, and the third connecting member 206 is connected with the signal lines 201 in the second column through the six via hole 203f penetrating the fifth insulation layer 204e.

Figure 16:
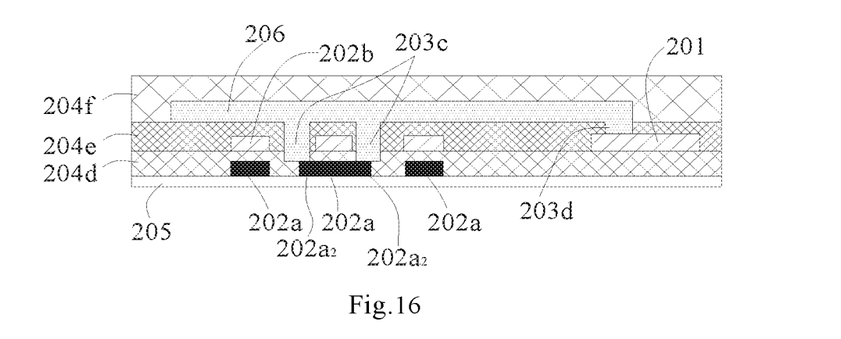
FIG. 16 is a cross-sectional view of the short-circuit unit as shown in FIG. 13 along the third column of signal line.

As shown in FIG. 16, the signal lines in the third column are short-circuited with the first short-circuit line 202a in the second row through the first connecting members $202a_2$ and the third connecting member 206, the third connecting member 206 is connected with the first connecting members $202a_2$ through two third via holes 203c penetrating the fourth insulation layer 204d and the fifth insulation layer 204e, and the third connecting member 206 is connected with the signal lines 201 in the third column through the fourth via hole 203d penetrating the fifth insulation layer 204e.

Figure 17:
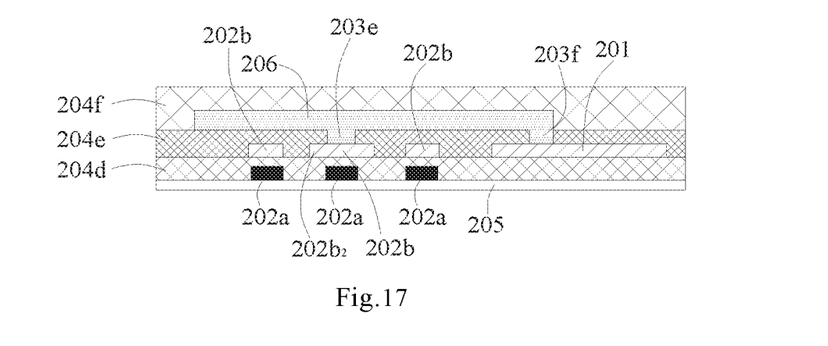
FIG. 17 is a cross-sectional view of the short-circuit unit as shown in FIG. 13 along the fourth column of signal line.

As shown in FIG. 17, the signal lines 201 in the fourth column are short-circuited with the second short-circuit line 202b in the second row through the second connecting member $202b_2$ and the third connecting member 206, the third connecting member 206 is connected with the second connecting member $202b_2$ through the fifth via hole 203e penetrating the fifth insulation layer 204e, and the third connecting member 206 is connected with the signal lines 201 in the fourth column through the six via hole 203f penetrating the fifth insulation layer 204e.

Figure 18:
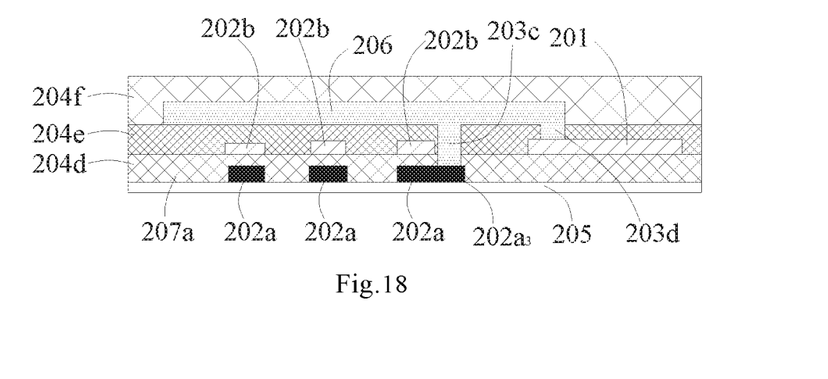
FIG. 18 is a cross-sectional view of the short-circuit unit as shown in FIG. 13 along the fifth column of signal line.

As shown in FIG. 18, the signal lines 201 in the fifth column are short-circuited with the first short-circuit line 202a in the third row through the first connecting member $202a_3$ and the third connecting member 206, the third connecting member 206 is connected with the first connecting member $202a_3$ through the third via hole 203c penetrating the fourth insulation layer 204d and the fifth insulation layer 204e, and the third connecting member 206 is connected with the signal lines 201 in the fifth column through the fourth via hole 203d penetrating the fifth insulation layer 204e.

Figure 19:
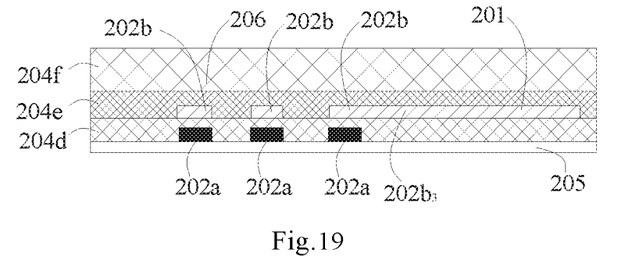
FIG. 19 is a cross-sectional view of the short-circuit unit as shown in FIG. 13 along the sixth column of signal line.

As shown in FIG. 19, the signal lines 201 in the sixth column are formed integrally with the second connecting member $202b_3$, and is short-circuited with the second short-circuit line 202b in the third column through the second connecting member $202b_3$.

Figure 20A:
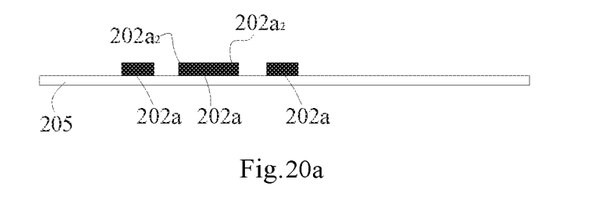
FIG. 20a is a cross-sectional view along the third column of signal line when the first short-circuit lines and the first connecting member are formed on the substrate.
Figure 20B:
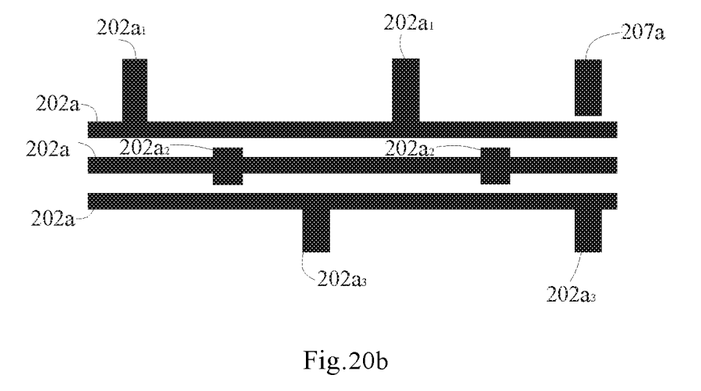
Figure 21:
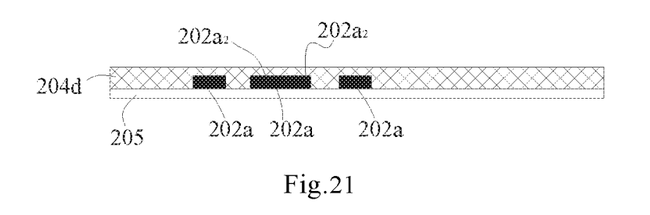
FIG. 21 is a cross-sectional view along the third column of signal line when the first insulation layer is formed above the first short-circuit lines.
Figure 22A:
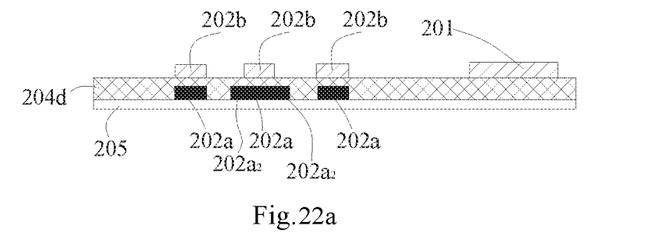
FIG. 22a is a cross-sectional view along the third column of signal line when the data lines and the second connecting member are formed on the first insulation layer.
Figure 22B:
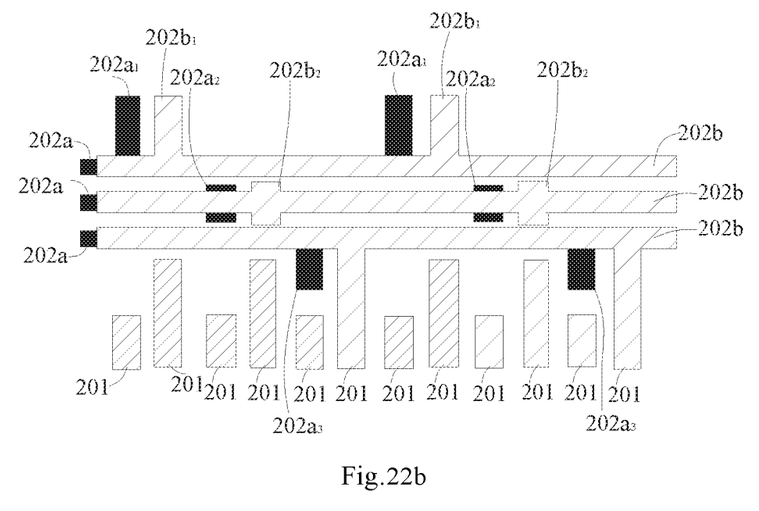
Figure 23:
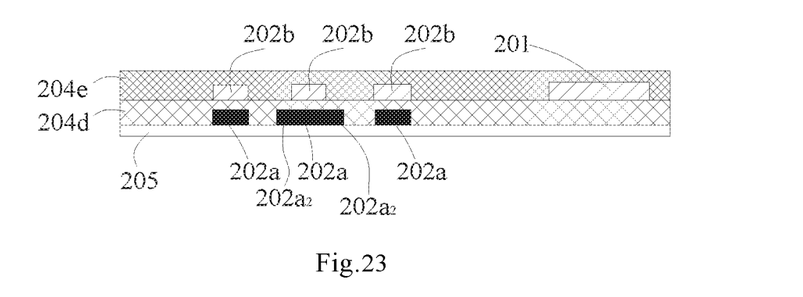
FIG. 23 is a cross-sectional view along the third column of signal line when the second insulation layer is formed above the data lines.
Figure 24A:
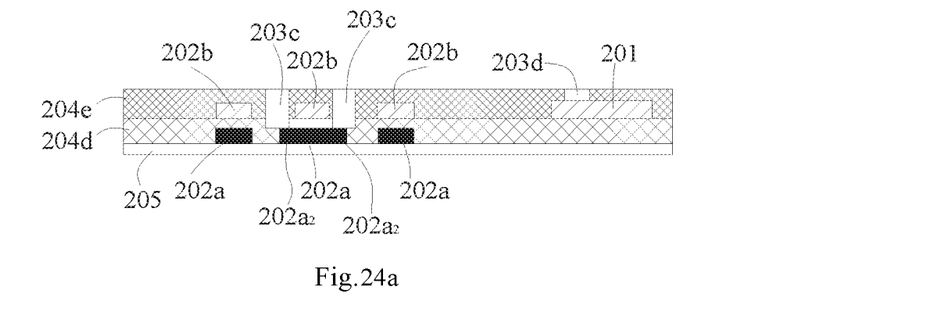
FIG. 24a is a cross-sectional view along the third column of signal line when the first via hole and the second via hole are formed on the second insulation layer.
Figure 24B:
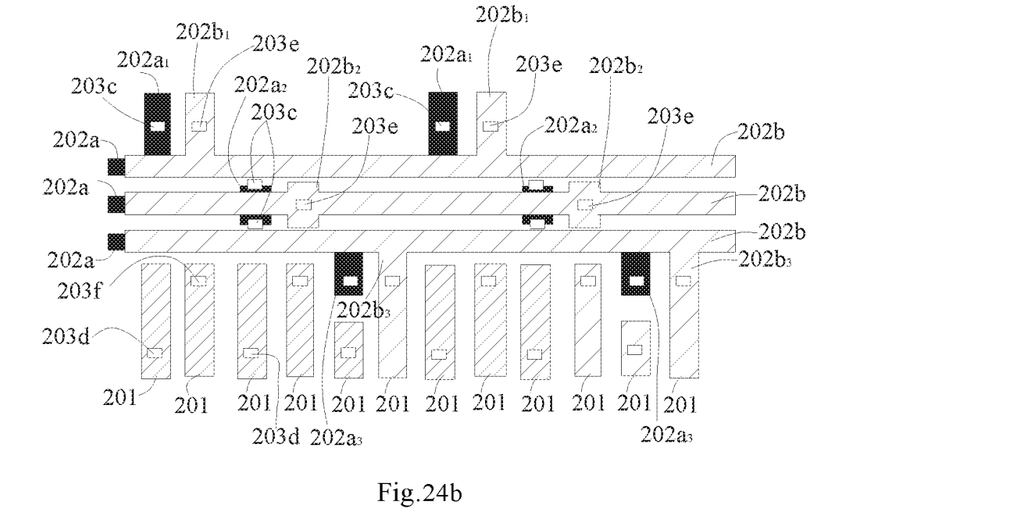
Figure 25:
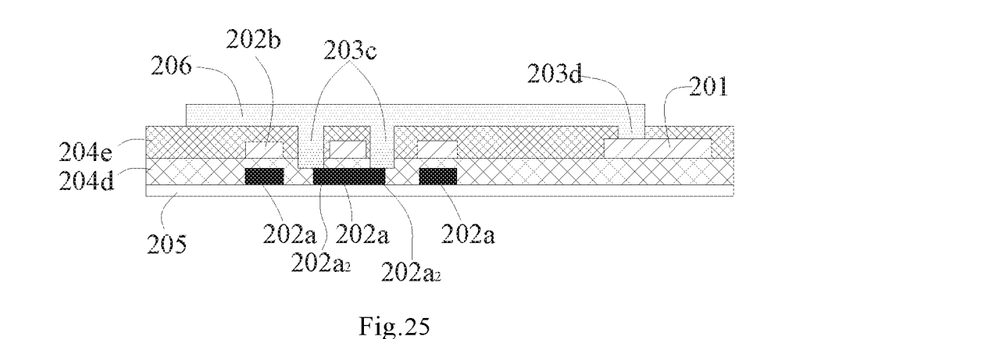
FIG. 25 is a cross-sectional view along the third column of signal line when the second short-circuit lines are formed on the second insulation layer.

The method of forming the short-circuit unit according to the second embodiment will be described with reference to FIGS. 20a through 25. The method comprises:

S1, forming a pattern including the first connecting member and the first short-circuit line 202a on the base substrate 205 (see FIGS. 20a and 20b, the shown first connecting member in FIG. 20a is the first connecting member $202a_2$);

S2, forming a fourth insulation layer 204d on the base substrate formed with the pattern including the first connecting member and the first short-circuit line (see FIG. 21);

S3, forming a pattern including the second short-circuit lines 202b and the signal lines 201 on the fourth insulation layer 204d (see FIGS. 22a and 22b);

S4, forming a fifth insulation layer 204e above the second short-circuit lines 202b (see FIG. 23);

S5, forming via holes (see FIGS. 24a and 24b, in FIG. 24b, the small rectangular frames represent the positions of the via holes), including the third through sixth via holes 203c, 203d, 203e and 203f. The third via hole 203c penetrates the fourth and fifth insulation layers 204d and 204e and is located above the first connecting member; the fourth via hole 203d penetrates the fifth insulation layer 204e and is located above the signal lines corresponding to the first connecting member; the fifth via hole 203e penetrates the fifth insulation layer 204e and is located above the second connecting member; the sixth via hole 203f penetrates the fifth insulation layer 204e and is located above the signal lines corresponding to the second connecting member;

S6, forming a pattern including the third connecting member 206 above the fifth insulation layer 204e having the via holes, wherein the third connecting member 206 is electrically connected with the first connecting member (or the second connecting member) and the signal lines through the above via holes (including the third through sixth via holes 203c, 203d, 203e and 203f);

S7, forming a sixth insulation layer 204f above the pattern including the third connecting member 206, the sixth insulation layer 204f being configured for protecting the third connecting member 206.

As a further aspect of the present invention, there is provided an array substrate. The array substrate comprises a display region and a non-display region surrounding the display region, the display region is provided with a plurality of data lines and a plurality of gate lines therein, the non-display region is provided with a short-circuit unit, wherein the short-circuit unit comprises:

a plurality of signal lines, the plurality of the signal lines are divided into a plurality of groups, each group comprising multiple signal lines, and the multiple signal lines in a same group are not adjacent to each other;

a plurality of short-circuit lines, each group of the signal lines correspond to one short-circuit line, and said short-circuit line electrically connects all of the signal lines in the group of the signal lines corresponding to said short-circuit line, the plurality of short-circuit lines are disposed in different layers.

The short-circuit unit in the array substrate is the short-circuit unit according to the above embodiments of the present invention. Since the width of the short-circuit unit is small, the non-display region of the array substrate may have smaller width, thus the narrow frame display can be achieved.

Preferably, in the short-circuit unit according to the present embodiment, the short-circuit lines comprise a plurality of first short-circuit lines and a plurality of second short-circuit lines, the plurality of first short-circuit lines are disposed in a same layer, and the plurality of second short-circuit lines are disposed in a same layer.

As an embodiment of the present invention, the number of the first short-circuit lines is three, and the number of the second short-circuit lines is three.

For reducing the width occupied by the short-circuit unit, the first short-circuit lines and the second short-circuit lines extend in a same direction, and the orthographic projection of the second short-circuit lines on the layer where the first short-circuit lines are located overlap at least a part of the first short-circuit lines.

The array substrate may comprise the short-circuit unit according to the first embodiment of the present invention, wherein the signal lines and the data lines are disposed in a same layer, the first short-circuit lines and the gate lines are disposed in a same layer, and the first insulation layer is disposed between the first short-circuit lines and the signal lines. The first insulation layer is located in the layer of a gate insulation layer of the array substrate, the second short-circuit lines are located in the layer of pixel electrodes of the array substrate, the second insulation layer is disposed between the second short-circuit lines and the signal lines. The first short-circuit lines are electrically connected with the corresponding signal lines through the first via holes above the first short-circuit lines and penetrating the first insulation layer, the second short-circuit lines are electrically connected with the corresponding signal lines through the second via holes below the second short-circuit lines and penetrating the second insulation layer.

Alternatively, the array substrate may comprise the short-circuit unit according to the second embodiment of the present invention, wherein the first short-circuit lines are located in a layer below the signal lines, the fourth insulation layer is disposed between the first short-circuit lines and the signal lines, the second short-circuit lines are located in a same layer as the signal lines and the signal lines are disposed at one side of the second short-circuit lines.

The short-circuit unit further comprises:

a plurality of first connecting members, the plurality of first connecting members are divided into a plurality of groups in one-to-one correspondence with first short-circuit lines, each group comprises multiple first connecting members, and each of the first short-circuit lines is electrically connected with the group of the first connecting members corresponding to the first short-circuit line;

a plurality of second connecting members, the plurality of second connecting members are divided into a plurality of groups in one-to-one correspondence with second short-circuit lines, each group comprises multiple second connecting members, and each of the second short-circuit lines is electrically connected with the group of the second connecting members corresponding to the second short-circuit line.

The short-circuit unit further comprises a plurality of third connecting members, a part of the plurality of third connecting members are configured for connecting the first connecting members with corresponding signal lines, and the other of the plurality of third connecting members are configured for connecting the second connecting members with corresponding signal lines.

It is readily understood to those skilled in the art that, the array substrate further comprises a first transparent electrode and a second transparent electrode below the first transparent electrode. One of the first transparent electrode and the second transparent electrode is used as the common electrode, and the other is used as the pixel electrode.

For simplification, preferably, the first short-circuit lines are disposed in the layer of the gate lines of the array substrate, the second short-circuit lines are disposed in the layer of the data lines, the third connecting members are disposed in the layer of the first transparent electrode, and the fifth insulation layer is provided between the third connecting members and the second connecting members;

the third connecting members configured for connecting the first connecting members with corresponding signal lines are connected with the first connecting members through the third via holes penetrating the fourth and fifth insulation layers, and are connected with the signal lines through the fourth via holes penetrating the fifth insulation layer;

the third connecting members configured for connecting the second connecting members with corresponding signal lines are connected with the second connecting members through the fifth via holes penetrating the fifth insulation layer, and are connected with the signal lines through the sixth via holes penetrating the fifth insulation layer.

In the array substrate, the width occupied by the short-circuit unit is small, the non-display region of the array substrate may have smaller width, thus the narrow frame design of the display panel can be achieved.

Moreover, since the width of the short-circuit unit is small, the laser beam for removing the short-circuit unit can cover the whole width of the short-circuit unit easily, thereby the problem of residue of the short-circuit unit on the array substrate can be reduced.

It should be understood that above embodiments are only exemplary embodiments for illustrating the principle of the present invention; however, the present invention is not limited thereto. Various variations and improvements can be made by persons skilled in the art without departing from the spirit and essence of the present invention, and these variations and improvements should also be considered to be within the protection scope of the present invention.

The invention claimed is:

1. A short-circuit unit, comprising:
a plurality of signal lines, which are divided into a plurality of groups, each group comprising multiple signal lines, and the multiple signal lines in a same group are not adjacent to each other; and
a plurality of short-circuit lines, wherein each group of the signal lines corresponds to one short-circuit line, and said short-circuit line electrically connects all of the signal lines in the group of the signal lines corresponding to said short-circuit line, the plurality of short-circuit lines are disposed in different layers, and the short-circuit lines in different layers are insulated from each other,
wherein the plurality of short-circuit lines comprise a plurality of first short-circuit lines and a plurality of second short-circuit lines, the plurality of first short-circuit lines are disposed in one layer, and the plurality of second short-circuit lines are disposed in a layer different from the layer of the plurality of first short-circuit lines,
and wherein the first short-circuit lines and the second short-circuit lines extend in a same direction, and the orthographic projection of the second short-circuit lines on the layer where the first short-circuit lines are located overlaps at least a part of the first short-circuit lines.

2. The short-circuit unit according to claim 1, wherein the number of the first short-circuit lines is at least three, and the number of the second short-circuit lines is at least three.

3. A short-circuit unit, comprising:
a plurality of signal lines, which are divided into a plurality of groups, each group comprising multiple signal lines, and the multiple signal lines in a same group are not adjacent to each other; and
a plurality of short-circuit lines, wherein each group of the signal lines corresponds to one short-circuit line, and said short-circuit line electrically connects all of the signal lines in the group of the signal lines corresponding to said short-circuit line, the plurality of short-circuit lines are disposed in different layers, and the short-circuit lines in different layers are insulated from each other,
wherein the plurality of short-circuit lines comprise a plurality of first short-circuit lines and a plurality of second short-circuit lines, the plurality of first short-circuit lines are disposed in one layer, and the plurality of second short-circuit lines are disposed in a layer different from the layer of the plurality of first short-circuit lines,
and wherein the first short-circuit lines are located in a layer below the signal lines, the first short-circuit lines are insulated from the signal lines by a first insulation layer, the second short-circuit lines are located in a layer above the signal lines, the second short-circuit lines are insulated from the signal lines by a second insulation layer, a first short-circuit line is electrically connected with the corresponding signal lines through a first via hole above the first short-circuit line and penetrating the first insulation layer, the second short-circuit line is electrically connected with the corresponding signal lines through a second via hole below the second short-circuit line and penetrating the second insulation layer.

4. The short-circuit unit according to claim 3, wherein the first short-circuit line is made of metal material; and/or the second short-circuit line is made of transparent electrode material.

5. The short-circuit unit according to claim 4, wherein a third insulation layer is formed above the second short-circuit lines.

6. The short-circuit unit according to claim 1, wherein the first short-circuit lines are located in a layer below the signal lines, the first short-circuit lines are insulated from the signal lines by a fourth insulation layer, the second short-circuit lines are located in a same layer as the signal lines and the signal lines are disposed at one side of the second short-circuit lines;
the short-circuit unit further comprises:
a plurality of first connecting members, wherein the plurality of first connecting members are divided into a plurality of groups in one-to-one correspondence with first short-circuit lines, each group comprises multiple first connecting members, each of the first short-circuit lines is electrically connected with the group of the first connecting members corresponding to the first short-circuit line, and each of the first connecting members is connected to a corresponding signal line;
a plurality of second connecting members, wherein the plurality of second connecting members are divided into a plurality of groups in one-to-one correspondence with second short-circuit lines, each group comprises multiple second connecting members, each of the second short-circuit lines is electrically connected with the group of the second connecting members corresponding to the second short-circuit line, and each of the second connecting members is connected to a corresponding signal line.

7. The short-circuit unit according to claim 6, wherein the short-circuit unit further comprises a plurality of third connecting members, a part of the plurality of third connecting members are configured for connecting the first connecting members with corresponding signal lines, and the other of the plurality of third connecting members are configured for connecting the second connecting members with corresponding signal lines.

8. The short-circuit unit according to claim 7, wherein the third connecting members are disposed in the upper layer of the second connecting members, and the third connecting members are insulated from the second connecting members by a fifth insulation layer;

the third connecting members configured for connecting the first connecting members with corresponding signal lines are connected with the first connecting members through third via holes penetrating the fourth and fifth insulation layers, and are connected with the signal lines through fourth via holes penetrating the fifth insulation layer; and the third connecting members configured for connecting the second connecting members with corresponding signal lines are connected with the second connecting members through fifth via holes penetrating the fifth insulation layer, and are connected with the signal lines through sixth via holes penetrating the fifth insulation layer.

9. The short-circuit unit according to claim 8, wherein the third connecting members are made of transparent electrode material.

10. The short-circuit unit according to claim 9, wherein a sixth insulation layer is formed above the third connecting members.

11. An array substrate, comprising a display region and a non-display region surrounding the display region, the display region is provided with a plurality of data lines and a plurality of gate lines, the non-display region is provided with a short-circuit unit, wherein the short-circuit unit comprises:

a plurality of signal lines, which are divided into a plurality of groups, each group comprising multiple signal lines, and the multiple signal lines in a same group are not adjacent to each other; and a plurality of short-circuit lines, wherein each group of the signal lines corresponds to one short-circuit line, and said short-circuit line electrically connects all of the signal lines in the group of the signal lines corresponding to said short-circuit line, the plurality of short-circuit lines are disposed in different layers, and the short-circuit lines in different layers are insulated from each other, wherein the plurality of short-circuit lines comprise a plurality of first short-circuit lines and a plurality of second short-circuit lines, the plurality of first short-circuit lines are disposed in one layer, and the plurality of second short-circuit lines are disposed in a layer different from the layer of the plurality of first short-circuit lines, and wherein the first short-circuit lines and the second short-circuit lines extend in a same direction, and the orthographic projection of the second short-circuit lines on the layer where the first short-circuit lines are located overlaps at least a part of the first short-circuit lines.

12. The array substrate according to claim 11, wherein the number of the first short-circuit lines is at least three, and the number of the second short-circuit lines is at least three.

13. The array substrate according to claim 11, wherein the signal lines and the data lines are disposed in a same layer, the first short-circuit lines and the gate lines are disposed in a same layer, and a first insulation layer is disposed between the first short-circuit lines and the signal lines; the first insulation layer is located in the layer of a gate insulation layer of the array substrate, the second short-circuit lines are located in the layer of pixel electrodes of the array substrate, a second insulation layer is disposed between the second short-circuit lines and the signal lines; a first short-circuit line is electrically connected with the corresponding signal lines through a first via hole above the first short-circuit line and penetrating the first insulation layer, a second short-circuit line is electrically connected with the corresponding signal lines through a second via hole below the second short-circuit line and penetrating the second insulation layer.

14. The array substrate according to claim 11, wherein the first short-circuit lines are located in a layer below the signal lines, a fourth insulation layer is disposed between the first short-circuit lines and the signal lines, the second short-circuit lines are located in a same layer as the signal lines and the signal lines are disposed at one side of the second short-circuit lines;

the short-circuit unit further comprises:

a plurality of first connecting members, which are divided into a plurality of groups in one-to-one correspondence with first short-circuit lines, each group comprises multiple first connecting members, and each of the first short-circuit lines is electrically connected with the group of the first connecting members corresponding to the first short-circuit line;

a plurality of second connecting members, which are divided into a plurality of groups in one-to-one correspondence with second short-circuit lines, each group comprises multiple second connecting members, and each of the second short-circuit lines is electrically connected with the group of the second connecting members corresponding to the second short-circuit line.

15. The array substrate according to claim 14, wherein the short-circuit unit further comprises a plurality of third connecting members, a part of the plurality of third connecting members are configured for connecting the first connecting members with corresponding signal lines, and the other of the plurality of third connecting members are configured for connecting the second connecting members with corresponding signal lines.

16. The array substrate according to claim 15, wherein the array substrate comprises a first transparent electrode and a second transparent electrode below the first transparent electrode, the first short-circuit lines are disposed in the layer of the gate lines of the array substrate, the second short-circuit lines are disposed in the layer of the data lines, the third connecting members are disposed in the layer of the first transparent electrode, and a fifth insulation layer is provided between the third connecting members and the second connecting members;

the third connecting members configured for connecting the first connecting members with corresponding signal lines are connected with the first connecting members through the third via holes penetrating the fourth and fifth insulation layers, and are connected with the signal lines through the fourth via holes penetrating the fifth insulation layer; and the third connecting members configured for connecting the second connecting members with corresponding signal lines are connected with the second connecting members through the fifth via holes penetrating the fifth insulation layer, and are connected with the signal lines through the sixth via holes penetrating the fifth insulation layer.

* * * * *